United States Patent [19]
Cho et al.

[11] Patent Number: 5,432,102
[45] Date of Patent: Jul. 11, 1995

[54] METHOD OF MAKING THIN FILM TRANSISTOR WITH CHANNEL AND DRAIN ADJACENT SIDEWALL OF GATE ELECTRODE

[75] Inventors: Seok W. Cho, Chungcheongbuk-do; Jong M. Choi, Seoul, both of Rep. of Korea

[73] Assignee: Goldstar Electron Co., Ltd, Chungcheengbuk-do, Rep. of Korea

[21] Appl. No.: 296,172

[22] Filed: Aug. 29, 1994

[30] Foreign Application Priority Data

May 12, 1994 [KR] Rep. of Korea .............. 10411/1994

[51] Int. Cl.[6] ..................................... H01L 21/336
[52] U.S. Cl. .................................. 437/21; 437/40; 437/44; 437/915
[58] Field of Search .............. 437/21, 40, 41, 44, 437/915; 257/67

[56] References Cited

U.S. PATENT DOCUMENTS

| | | | |
|---|---|---|---|
| 4,581,623 | 4/1986 | Wang | 437/915 |
| 4,651,408 | 3/1987 | MacElwee | 437/915 |
| 4,987,092 | 2/1991 | Kobayashi et al. | 437/915 |
| 4,997,785 | 3/1991 | Pfiester | 437/915 |
| 5,122,476 | 6/1992 | Fazan et al. | 437/915 |
| 5,286,664 | 2/1994 | Horiuchi et al. | 437/40 |

OTHER PUBLICATIONS

"High Reliability & High Performance ,35μM Gate-Inverted TFT'S for 16M Bit SRAM Application Using Self-Aligned LDD Structures" C. T. Liu et al., IEDM Digest, Dec. 1992, pp. 823–826.

*Primary Examiner*—Tom Thomas

[57] ABSTRACT

A thin film transistor and a method which forms a channel region (c), a lightly doped drain region (LDD) region and, optionally, an offset region (o), in a portion of a semiconductor layer which is adjacent a sidewall of the gate electrode without the use of photo masks, thereby increasing the permissible degree of miniaturization and improving production yield.

9 Claims, 5 Drawing Sheets

METHOD OF MAKING THIN FILM TRANSISTOR WITH CHANNEL AND DRAIN ADJACENT SIDEWALL OF GATE ELECTRODE

FIELD OF THE INVENTION

This invention relates, in general, to a thin film transistor and, more particularly, to a thin film transistor structure suitable to static random access memory (hereinafter referred to as "SRAM") cells and a method for making thereof.

DESCRIPTION OF RELATED ART

A thin film transistor is generally used in an SRAM device with 1 Mbit or more memory in lieu of a load resistor. It is also used as a switching device for switching the image data signals of each pixel region in a liquid crystal display.

To produce a quality SRAM device, the thin film transistors thereof must be decreased in Off current and increased in On current, thereby saving electric power and improving the memory properties in the SRAM cell. In the last few years many research and development efforts have been directed to the improvement of On/Off current ratio.

For a better understanding of the background of the invention, a prior art fabrication method to improve the On/Off current ratio in a thin film transistor of an SRAM device will be described with reference to FIGS. 1A through 1D. An MOS thin film transistor illustrated in the figures is fabricated by enlarging grain size by solid-phase growth of a polysilicon layer and a gate of polysilicon. The solid-phase growth is carried out by annealing at around 600° C. for about 24 hours.

First, over an insulating substrate 1 or a substrate having an insulation layer thereon (hereinafter "substrate" refers to either of the two such structures) a polysilicon layer is deposited, and the polysilicon layer is patterned by a photo-etching process utilizing a gate mask so as to form a gate electrode 2, as shown in FIG. 1A.

Then, using a chemical vapor deposition (hereinafter CVD) process, a gate insulating layer 3, as shown in FIG. 1B, and a polysilicon layer 4 are sequentially deposited, and the polysilicon layer 4 is subjected to annealing so as to enlarge its grain size.

Thereafter, over the polysilicon layer 4, there is deposited a photosensitive layer 5 which is subsequently exposed and developed to mask a portion thereof, as shown in FIG. 1C. At this time, the masking for what will become a channel region "c" (shown in FIG. 1D) and an "offset region "o" is carried out in such a way that an unmasked portion of polysilicon layer 4 overlaps the gate electrode 2 and so that there exists an unmasked portion of polysilicon layer 4 separated from the gate electrode 2 by a horizontal distance "x".

Finally, P-type dopant (for example, $BF_2$) ions are implanted into the uncovered polysilicon layer, as indicated by arrows in FIG. 1C, to form the source region 6a and drain region 6b, as shown in FIG. 1D. In this figure, reference symbols "s", "c", "o" and "d" designate a source region, a channel region, an offset region and a drain region in this layer, respectively.

However, the prior art method has the following problems.

First, transistor reliability is likely to become deteriorated because the amount of off-current in the prior art thin film transistor is extremely dependent on the accuracy of the alignments in masking the layers.

Second, the channel region and offset region of the prior art thin film transistor are formed in the horizontal plane and miniaturization of cell size demands a reduction in the channel length and offset region, which results in an increased leakage current and offset current.

Third, the prior art fabrication method defines the channel region and the offset region by masking processes, including exposure and development steps. Thus, additional process steps are required as compared with the invention.

SUMMARY OF THE INVENTION

Therefore, an object of the invention is to solve the aforementioned problems encountered in the prior art by providing a novel thin film transistor structure having a higher On/Off current ratio, and a method of making thereof, which is capable of much greater downsizing of the cell and which has a superior production yield.

In accordance with a first aspect of the invention, there is provided a thin film transistor structure comprising: a substrate; a gate electrode having two sidewalls and a top surface on a predetermined portion of the substrate; a sidewall spacer layer at one sidewall of the gate electrode; an insulating layer on the sidewall spacer layer, the top surface of the gate electrode, the other sidewall of the gate electrode, and the substrate; a semiconductor layer on the insulating layer and having a channel region at the other sidewall of the gate electrode; and a source region and a drain region in the semiconductor layer.

In accordance with a second aspect of the invention, there is provided a thin film transistor structure comprising: a substrate; a gate electrode having two sidewalls and a top surface on a predetermined portion of the substrate; a gate cap insulating layer on the top surface of the gate electrode; a sidewall spacer layer at one sidewall of the gate electrode; a second insulating layer on the sidewall spacer layer, the gate cap insulating layer, the other sidewall of the gate electrode layer, and the substrate; a semiconductor layer on the second insulating layer and having a channel region; and, a source region and a drain region in the semiconductor layer.

In accordance with a third aspect of the invention, there is provided a method for making a thin film transistor comprising the steps of: forming a gate electrode having opposite sidewalls and a top surface on a predetermined portion of a substrate; forming a sidewall spacer layer at one sidewall of the gate electrode; forming an insulating layer on the sidewall spacer layer, the top surface of the gate electrode, the sidewall opposite the sidewall spacer layer, and the substrate; forming a semiconductor layer on the insulating layer, the semiconductor layer having a channel region at the other sidewall of the gate electrode; and, forming a source region and a drain region in the semiconductor layer.

In accordance with a fourth aspect of the invention, there is provided a method of making a thin film transistor comprising: forming a gate electrode having two sidewalls and a top surface on a predetermined portion of a substrate; forming a gate cap insulating layer, having a sidewall, on the top surface of the gate electrode; forming a sidewall spacer layer at one sidewall of the gate electrode; forming a second insulating layer on the sidewall spacer layer, the gate cap insulating layer, the other sidewall of the gate electrode which is opposite the spacer layer, and the substrate; forming a semiconductor layer on the second insulating layer and having a channel region at the other sidewall of the gate electrode; and, forming a source region and a drain region in the semiconductor layer.

BRIEF DESCRIPTION OF THE DRAWINGS

The above object and other advantages of the invention will become more apparent by reference to the below detailed description with reference to the attached drawings in which.

DETAILED DESCRIPTION OF THE INVENTION

Figure 1A:
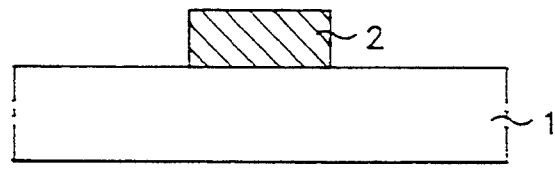
FIGS. 1A through 1D are schematic, cross-sectional views illustrating a prior art method of making a thin film transistor.
Figure 1B:
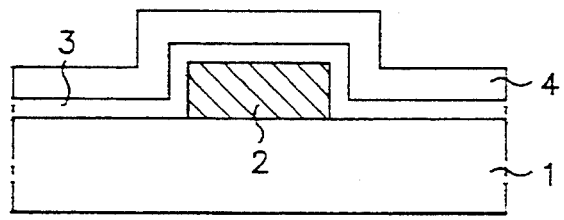
Figure 1C:
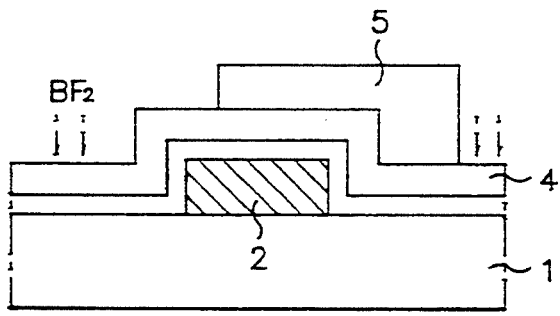
Figure 1D:
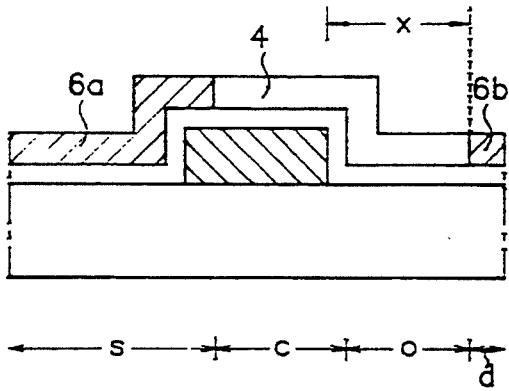

Hereinafter, the preferred embodiments of the invention will be described with reference to the accompanying drawings wherein like reference numerals designate like parts, respectively.

Figure 2A:
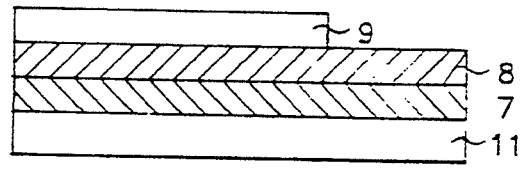
FIGS. 2A through 2E are schematic, cross-sectional views illustrating a method for making a thin film transistor according to a first embodiment of the invention.
Figure 2B:
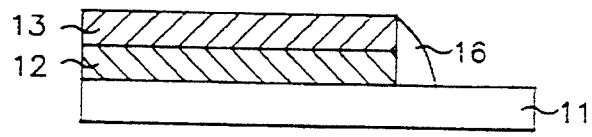
Figure 2C:
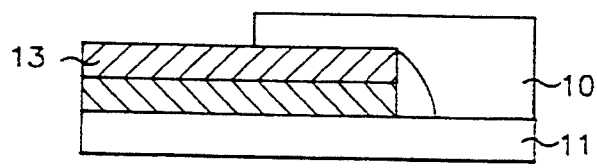
Figure 2D:
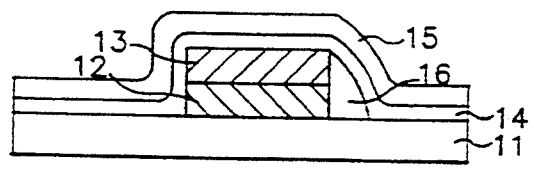

The process steps for forming the first embodiment of the invention are illustrated in FIGS. 2A–2E. As shown in FIG. 2A, over a substrate 11, a semiconductor layer 7 and a first insulating layer 8 are formed. The first insulating layer is formed, for example, of an oxide layer or a nitride layer. Layer 9 is a photosensitive layer which has been exposed and developed so as to define a step boundary. As shown in FIG. 2B, layers 7 and 8 are subjected to a selective etch to remove these layers to the right of the step boundary and thereby form a sidewall in layers 7 and 8 at the step boundary. The photosensitive layer 9 is then removed and a sidewall spacer 16 is formed adjacent the step boundary by applying an insulating layer or semiconductor layer and subjecting it to anisotropic etching. The purpose of the sidewall spacer 16 is not to cover and define a lightly doped drain (hereinafter LDD) region as described, for example, in an article by Liu et al, titled "High Reliability and High Performance 0.35 Gate-Inverted TFT's for 16 Mbit SRAM Applications Using Self-Aligned LDD Structures", but rather is to prevent a channel and LDD region from being formed at this side of gate electrode 12 (formed in the next step) during a still later ion implantation step (that step shown in FIG. 2E). In FIG. 2C a photosensitive layer 10 is deposited in such a way as to mask a predetermined area of layer 7 on the other side of the gate electrode 12 as well as to cover sidewall spacer 16 and the substrate 11 which is adjacent the sidewall spacer 16. Using this mask, layers 7 and 8 are etched so as to form a gate electrode 12 (formed of the material of layer 7), and a gate cap insulating layer 13 (formed, for example, of the material of layer 8), as shown in FIG. 2D. In this figure it is also shown that, after removing the photosensitive layer 10, a layer 14 (which may be formed, for example, of an insulating material) and a semiconductor layer 15 (which may be formed, for example, of polysilicon or amorphous silicon with a thickness of about 200 Angstroms to about 500 Angstroms) are sequentially deposited by the use of a CVD process.

Figure 2E:
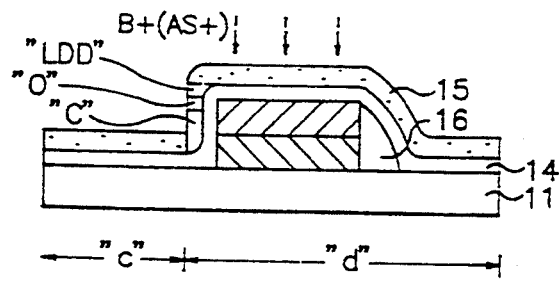

Finally, without a masking process, dopant ions are implanted into the semiconductor layer 15, as indicated by arrows, so as to form a source region "s" and a drain region "d", as shown in FIG. 2E. Implantation of P-type dopant (e.g., boron or $BF_2$) ions under acceleration energy of 5 to 20 Kev will result in a P-type thin film transistor with an impurity density of approximately $1 \times 10^{14}$ to approximately $1 \times 10^{16}$ atoms/$cm^2$. By contrast, implantation of N-type dopant (e.g., As or P) ions under an acceleration energy to 10 to 50 Kev will result in an N- type thin film transistor with an impurity density of approximately $1 \times 10^{14}$ to approximately $1 \times 10^{16}$ atoms/$cm^2$. An LDD region (illustrated in FIG. 2E as "LDD") extends below the drain region "d" in the semiconductor layer. Below the LDD region there may be an offset region "o" in the semiconductor layer. The portion of the semiconductor layer 15 which is adjacent the wall of the gate electrode comprises the channel region "c".

Figure 3:
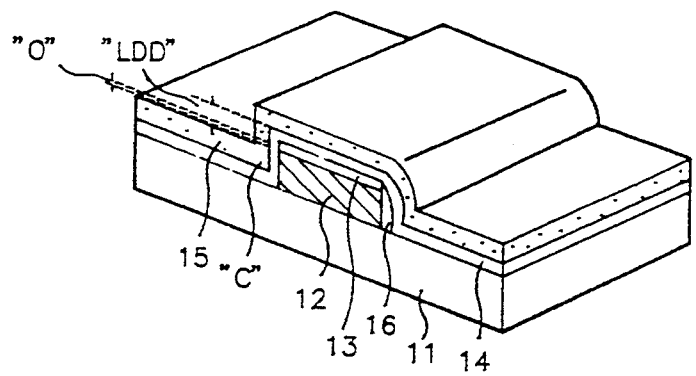
FIG. 3 is a schematic, perspective view showing the structure of a thin film transistor according to the first embodiment of invention.

Referring now to FIG. 3, there is illustrated the structure of a thin film transistor made by the method according to the invention. As shown in this figure, the thin film transistor comprises a substrate 11 and a gate structure formed on a predetermined portion of the substrate 11. The gate structure includes a gate electrode 12 covered with a gate cap insulating layer 13, a sidewall spacer 16, a second insulating layer 14 covering the top surfaces of the thus-far formed device, and a semiconductor layer 15 covering the second insulating layer 14. The sidewall spacer 16 is formed at one sidewall of the gate electrode 12, and the semiconductor layer 15 has a channel region "c" formed in a portion thereof adjacent the wall of the gate electrode which is opposite sidewall spacer 16.

Figure 4:
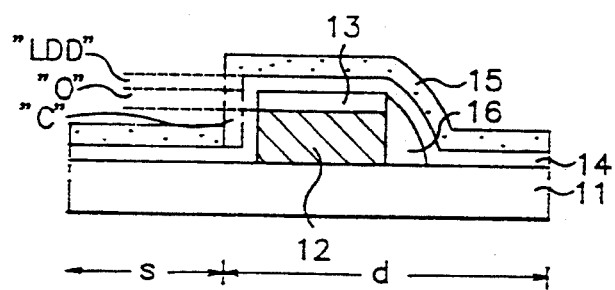
FIG. 4 is a schematic view showing the structure of a thin film transistor according to the first embodiment of invention.
Figure 5A:
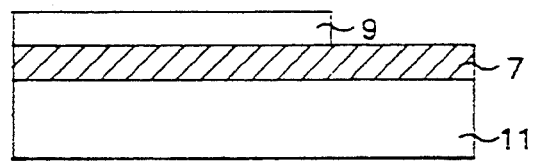
FIGS. 5A through 5E are schematic, cross-sectional views illustrating a method for making a thin film transistor according to a second embodiment of the invention; and, FIG. 6 is a schematic, perspective view showing the structure of a thin film transistor according to a second embodiment of invention.
Figure 5B:
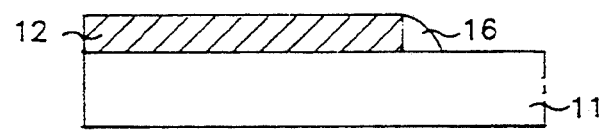
Figure 5C:
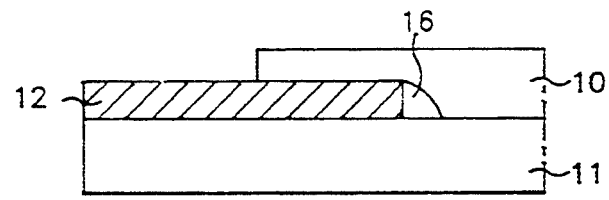
Figure 5D:
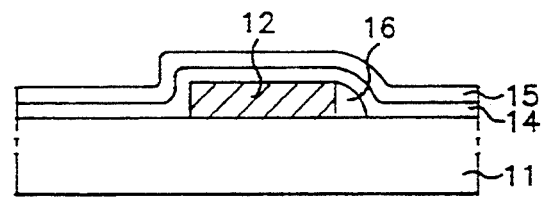
Figure 5E:
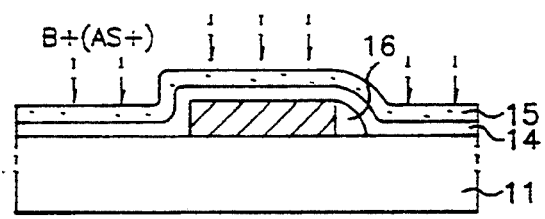
Figure 6:
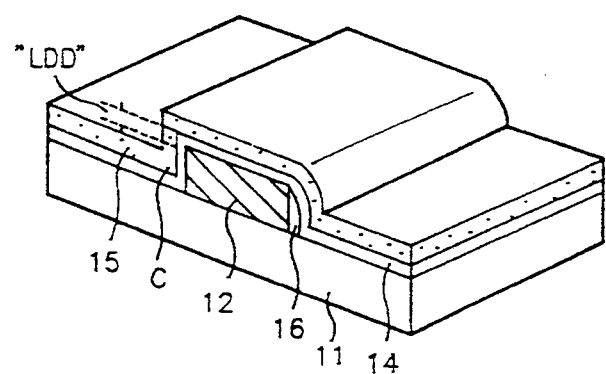

As shown in FIG. 4, the implantation of dopant ions by the method of the invention creates a design in the semiconductor layer 15 in which the drain region "d" is separated from the gate electrode 12 and wherein the channel region "c" is formed in that portion of the semiconductor layer 15 adjacent the wall of the gate electrode 12 which is opposite sidewall spacer 16. As also shown in FIG. 2E, an LDD region extends in semiconductor layer 15 below the drain region "d" and, below the LDD region, there is provided an offset region "o" having a length dependent on the thickness of gate cap insulating layer 13. The concentration density of the dopant ions implanted in the LDD region decreases with depth; thus, a density gradient exists in this region.

The offset region "o" is formed between the LDD region and the channel "c" according to the thickness of the gate cap insulating layer 13. No gate cap insulating layer 13 results in no offset region. In contrast, a thick gap gate insulating layer 13 makes the offset region deep. Therefore, in accordance with the invention, Off-current variation in transistor production can be reduced without a masking process, because the depth of the offset is determined by the thickness of the gate cap insulating layer 13, rather than relying on a photo mask alignment process to determine the offset region as in the prior art as described previously in discussing the disadvantages of the prior art fabrication method.

A second embodiment of the invention is shown in FIGS. 5A–5E and 6, wherein the same steps are illustrated as in FIGS. 2A–2E and the same elements are illustrated as in FIG. 3, except that there is no layer 8 applied and no off-set region "o" as a result of their being no gate cap insulating layer 13.

As described hereinbefore, the thin film transistor and method of making according to the invention have advantages as follow.

First, not only can the device properties be enhanced but also production yield can be improved by the simplification attributed to the source and drain as well as the LDD region being formed without a masking process.

Second, the degree of integration can be increased by virtue of the fact that the length of the channel "c" of the thin film transistor is determined by the height of the gate electrode 12; thus, the cell can be downsized more than when the channel length is determined by the width of the gate electrode. In addition, the cell size can be further miniaturized by the fact that the height of the offset region is determined by the thickness of the gate cap insulating layer.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for making a thin film transistor comprising the steps of:
    forming a gate electrode, having two sidewalls and a top surface, on a predetermined portion of a substrate;
    forming a sidewall spacer layer at one sidewall of the gate electrode;
    forming an insulating layer on the sidewall spacer layer, the top surface of the gate electrode, the other sidewall of the gate electrode which is opposite the sidewall spacer layer, and the substrate;
    forming a semiconductor layer on the insulating layer, the semiconductor layer having a channel region at said other sidewall of the gate electrode; and
    forming a source region and a drain region in the semiconductor layer.

2. The method of claim 1, the semiconductor layer consisting essentially of polysilicon or amorphous polysilicon.

3. The method of claim 1, further including forming an LDD region between the drain region and the channel region.

4. The method of claim 1, said substrate being planar and said sidewall opposite the sidewall spacer being perpendicular the substrate surface.

5. A method of making a thin film transistor comprising the steps of:
    forming a gate electrode, having two sidewalls and a top surface, on a predetermined portion of a substrate;
    forming a gate cap insulating layer, having a sidewall, on the top surface of the gate electrode;
    forming a sidewall spacer layer at one sidewall of the gate electrode;
    forming a second insulating layer on the sidewall spacer layer, the gate cap insulating layer, the other sidewall of the gate electrode which is opposite the spacer layer, and the substrate;
    forming a semiconductor layer on the second insulating layer, said semiconductor layer having a channel region at said other sidewall of the gate electrode; and,
    forming a source region and a drain region in the semiconductor layer.

6. The method of claim 5, the sidewall spacer layer being a semiconductor layer.

7. The method of claim 5, the semiconductor layer consisting essentially of a polysilicon or an amorphous silicon.

8. The method of claim 5, further including the step of forming an offset region between the drain region and the channel region.

9. The method of claim 5, said substrate being planar and said sidewall of the gate electrode opposite the sidewall spacer being perpendicular the substrate surface.

* * * * *